United States Patent [19]
Urakawa

[11] Patent Number: 5,991,230
[45] Date of Patent: Nov. 23, 1999

[54] SYNCHRONOUS RANDOM ACCESS MEMORY

[75] Inventor: Yukihiro Urakawa, Tokyo, Japan

[73] Assignee: Kabushiki Kaisha Toshiba, Kawasaki, Japan

[21] Appl. No.: 09/044,093

[22] Filed: Mar. 19, 1998

[30]   Foreign Application Priority Data

Mar. 19, 1997  [JP]  Japan ................................ P9-066742

[51] Int. Cl.⁶ .................................................. G11C 8/00
[52] U.S. Cl. ............... 365/233; 365/189.05; 365/230.03; 365/230.05; 365/230.09
[58] Field of Search ............................... 365/233, 230.03, 365/230.05, 189.05, 203, 230.08, 230.09

[56]   References Cited

U.S. PATENT DOCUMENTS

| | | | |
|---|---|---|---|
| 5,323,358 | 6/1994 | Toda et al. | 365/230.09 |
| 5,384,745 | 1/1995 | Konishi et al. | 365/230.03 |
| 5,390,149 | 2/1995 | Vogley et al. | 365/189.01 |
| 5,594,704 | 1/1997 | Konishi et al. | 365/233 |
| 5,689,473 | 11/1997 | Toda | 365/233 |
| 5,812,488 | 9/1998 | Zagar et al. | 365/233 |
| 5,818,793 | 10/1998 | Toda et al. | 365/233 |
| 5,867,446 | 2/1999 | Konishi et al. | 365/233 |
| 5,872,742 | 2/1999 | Kengeri et al. | 365/233 |

*Primary Examiner*—David Nelms
*Assistant Examiner*—Hien Nguyen
*Attorney, Agent, or Firm*—Foley & Lardner

[57]   ABSTRACT

In a synchronous random access memory, a data readout period, a data writein period, and a precharge period (or a reset period) are performed in order under the control of a control circuit 10, and the synchronous random access memory operates so that the executions of the data readout operation and the data writein operation are not overlapped under the control of the control circuit 10 comprising a sense amplifier activation generation circuit 11, a writein control signal generation circuit 12, and a reset signal generation circuit 13.

12 Claims, 8 Drawing Sheets

SYNCHRONOUS RANDOM ACCESS MEMORY

BACKGROUND OF THE INVENTION

1. Field of the Invention

The present invention relates to a synchronous random access memory performing data access operation such as a data readout operation/a data writein operation in synchronism with a clock signal, and more particularly, it relates to a synchronous random access memory capable of performing a memory access cycle in which a data readout process, a data writein process, and a reset process are performed sequentially in order.

2. Description of the Prior Art

Recently, synchronous random access memories are widely used as cache memories incorporated in central processing units (CPU) and the like because the synchronous random access memories are very fitted to pipeline processes. In addition, because the synchronous random access memories are capable of absorbing a signal skew and they may be applied to higher speed systems, they are becoming one of the leading mainstreams of the memory field.

FIG. 1 is a diagram showing a configuration of a conventional synchronous random access memory described above. FIG. 2 is a timing chart showing the timing of the memory access operation of the conventional synchronous random access memory shown in FIG. 1.

The conventional synchronous random access memory shown in FIG. 1 has a most simple configuration in which the number of ports for each of the data output and data input is one. In FIG. 1, the memory array 101 comprises m×(n×d) memory cells (each of m, n, and d is a natural number). This character "m" designates the number of rows (or a row number) in the X direction and the character "n" denotes the number of column (or a column number) in the Y direction, and the character "b" indicates the number of bits.

Address signals to be provided in order to access a target memory cell in the memory array 101 are provided to a row decoder 102 for selecting a target row and a column decoder 103 for selecting a target column. Lines for transferring output data items from the row decoder 102 are connected to the "m" word lines 104. Only the selected word line 104 is activated in synchronism with the rising edge of a clock signal. Simultaneously, a precharge circuit 106 connected to all of the bit lines 105 enters an inactive state, so that the reset state of the bit lines 105 is released. Thereby, a small signal of the data item stored in the target memory cell is output to the bit lines 105 of (n×b) pairs formed in the column direction.

On the other hand, one pair of all of the bit lines 105 is selected based on the column selection signal generated by the column decoder 103. The small signal having a small voltage potential on the bit lines 105 in the selected pair "b" is inputted to corresponding "b" sense amplifiers 108. Then, the sense amplifier is activated by the sense amplifier activation signal. The small signal provided to the bit lines 105 is amplified by the sense amplifier 108 to obtain the data output signal of "b" bits of a CMOS level. The word line 104 enters the inactive state in synchronism with the falling edge of the clock signal, so that all of the memory cells 107 enter the inactive state. The precharge circuit 106 becomes the active state simultaneously, all of remained signals on the bit lines are reset. The data read out process is performed based on the operations described above.

On the contrary, in the data writein process, a writein buffer 109 corresponding to each bit line is connected to each of the bit line 105 selected by the column decode signal output from the column decoder 103. The operation timing of each bit line 105 and the word line 104 activated by the row decoder 102 is basically equal to the operation timing in the data readout operation.

Further, recently, methods to increase the operation speed by performing a parallel processing are widely and frequently used. In the systems of the parallel processing, memories having multiple ports are often used because the contents of data stored in the memory are commonly used for processes that are executing in parallel. When the memory having the multiple ports is used, there is the advantage that it is possible to avoid the occurrence of a resource conflict that reduces the performance of the system and also possible to easily control the coherent caused between units executed in parallel. In those system, to mount a high speed memory having a larger memory size on those systems leads to increase the performance of the system. Thereby, In recent years, systems incorporating a memory of a larger memory size based on the scaling of process have been developed and used.

Next, a description will be given of the operation of the conventional memory of parallel processing described above.

FIG. 3 is a diagram showing a configuration of a conventional synchronous random access memory having two ports. FIG. 4 is a timing chart of the operation of the conventional synchronous random access memory shown in FIG. 3.

In order to operate each port independently in the conventional synchronous random access memory having two ports shown in FIG. 3, all components other than the memory cell 107 in the conventional synchronous random access memory shown in FIG. 1 are incorporated in duplicate. That is, the synchronous random access memory shown in FIG. 3 comprises row decoders (A and B) 111, column decoders (A and B) 112, sense amplifiers (A and B) 113, write-in buffers (A and B) 114, precharge circuits (A and B) 115, word lines (A and B) 116, bit lines (A and B) 117 for ports A and B. These circuit components performed independently to each other corresponding to control signals for each of the ports A and B such as an address signal, a sense amplifier activation signal, and a write-in control signal. In this operation, a plurality of the memory cells 118 arranged in an array form in the memory array 119 are commonly used.

The explanation of the operation of each of the ports A and B is omitted here because this operation is the same as that of the conventional synchronous random access memory having one port shown in FIG. 1.

In the synchronous memory of the multiple-ports having the configuration shown in FIG. 3 formed by using fine process, the following drawbacks are caused: First, the delay as a result of the scaling of a memory having a fined structure is becoming smaller than the delay of the wiring. The primary reason of the change of the delay is the increasing of a RC propagation delay caused by increasing the wiring resistance. It is difficult to perform the scaling of the structure of the memory in a longitudinal direction. Thereby, the aspect ratio (a thickness of a wiring layer/ a width of the wiring layer) of the wiring becomes increased and the ratio of the thickness of the wiring layer to the thickness between adjacent layers becomes increased simultaneously. As a result, there is an increasing tendency that the magnitude of a coupling capacitance between the adjacent wiring layers becomes greater than that of the ground capacitance of the wiring. Accordingly, when a memory having multiple ports is designed by using the fine processing, there is a possibility to cause an operation error by the cross talk of signals between ports. The reason will be explained by using a conventional memory having two ports, as shown in FIG. 5.

Both the two pairs of bit lines A and /A 117, and B and /B 117 are placed in the configuration shown in FIG. 5. That is, the bit lines A and B, and /A and /b corresponding to different ports are placed so that each of the two pairs comprising the bit lines A and B and the bit lines /A and /B are adjacent to each other. In this configuration, of course, there is a possibility that the cross talk of a signal happens between the bit lines of adjacent memory cells.

As described above, when the process scaling becomes fine, the wiring capacitance between bit lines becomes greater than the ground capacitance. As shown in the timing chart of the operation of the conventional synchronous random access memory having two ports, as shown in FIG. 4, when one port enters the data readout operation and another port enters the data writein operation, the cross talk noise generated by the bit line (for example, it is operable under a CMOS voltage level, for example, 3.3 volts when the voltage of a power source is 3.3 volts) under the data writein operation is added onto the bit line under the data readout operation in which a several tens volts of a signal having a small amplitude is transferred.

In the normal operation, the bit line under the data readout operation is only discharged by a small current in a memory cell, so that this bit line has a higher impedance. Accordingly, the voltage level of the bit line used in the data readout operation is easily inverted. Temporarily, when the capacitance between the bit lines is approximately ⅓ times of the total capacitance, this cross talk noise of approximately one volt (1 V) will affect the bit line for the data readout operation. In general, because a bit line to be used for the data readout operation is accessed by a small current flowing from a memory cell, it takes a long time period to recover the data contents of the memory cells. This causes to increase the time required to the data readout operation. Furthermore, in the worst case, an output voltage level of the bit line is inverted in voltage, and thereby error operation will happen. In the prior art, in order to avoid the generation of the cross talk caused between bit lines, a power source/ground line is formed as a shield between bit liens. This method may reduce the occurrence of the cross talk approximately 10%. However, it is difficult to suppress the increasing of the time required for the data readout operation caused by the cross talk noise completely by this method, and this method causes to increase the wiring area.

The conventional drawbacks describe above are caused in a general memory of one port. When a memory array is divided into a plurality of banks, each bank performs the data readout operation and the data write-in operation independently, the cross talk noise is generated between the memory cells located at the boundary of the banks. This problem about the cross talk noise will be caused in a memory in which the data read and write operations may be performed per bit.

As described above, in the conventional memory capable of performing the data readout operation and the data write-in operation independently, the wiring capacitance between bit lines is increased by the fine processes. Thereby, when the data readout operation and the data writein operation are performed simultaneously between the adjacent bit lines, the voltage change of the bit line in the data writein operation affects the voltage change of the bit line in the data readout operation because the magnitude of the cross talk noise between bit lines is increased. In this case, the correct data items stored in the memory cells are changed. Thereby, it takes a long time period to recover the contents of the data stored in the memory cells. In addition to this drawback, the error operation is also occurred.

SUMMARY OF THE INVENTION

Accordingly, an object of the present invention is, with due consideration to the drawbacks of the conventional synchronous random access memory, to provide a synchronous random access memory having the function in which the changes of voltage potentials on bit lines during a data writein operation does not affect a data readout operation without causing a larger time delay during the data readout operation and without causing any error operation even if the data writein operation and the data readout operation are performed between adjacent bit lines.

In accordance with a preferred embodiment according to the present invention, a synchronous random access memory comprises a plurality of memory cells for storing data items, selection means for selecting one of the plurality of memory cells according to an input address, readout means for reading a data item stored in one of the plurality of memory cells based on the input address selected by the selection means, writein means for writing a data item into one of the plurality of memory cells based on the input address selected by the selection means, reset means for resetting the synchronous random access memory into a reset state in which a data readout operation from and a data writein operation to the plurality of memory cells may be performed, and control means for controlling operation of the plurality of memory cells during a reset period, a data writein period, and a data readout period for the plurality of memory cells. In the synchronous random access memory described above, the control means controls that in the reset period the plurality of memory cells are into the reset state in which the data readout operation from and the data writein operation to the plurality of memory cells may be performed, in the data readout period a data item stored in one of the plurality of memory cells, that is selected by the selection means after a completion of the reset period, is read by the readout means, and in the data writein period a data item is written into one of the plurality of memory cells, that is selected by the selection means after a completion of the data readout period, and wherein the control means controls that the reset period, the data readout period, and the data writein period forming a memory cycle are performed in order, and the control means controls that all of memory access operations to the plurality of memory cells are performed within the data readout period and the data writein period in synchronism with a clock signal.

In the synchronous random access memory as another preferred embodiment according to the present invention, the control means controls the memory access operation to the plurality of memory cells so that the reset period is shifted to the data readout period when a first voltage level of the clock signal is switched to a second voltage level of the clock signal, and the data readout period is shifted to the data writein period after a predetermined time is elapsed after the first voltage level of the clock signal is switched to the second voltage level, and the data writein period is shifted to the reset period after the second voltage level of the clock signal is switched to the first voltage level, or after a predetermined time is elapsed after the second voltage level of the clock signal is switched to the first voltage level.

In the synchronous random access memory as another preferred embodiment according to the present invention, the control means controls the memory access operation to the plurality of memory cells so that the reset period is shifted to the data readout period when a first voltage level of the clock signal is switched to a second voltage level of the clock signal, and the data readout period is shifted to the data writein period in synchronism with a sense amplifier activation control signal indicating to start an operation to latch and then amplify a data item stored in one of the plurality of memory cells read on bit lines, and the data writein period is shifted to the reset period in synchronism with a writein control signal Indicating to start the data writein operation and indicating a time length of the data writein operation.

In the synchronous random access memory as another preferred embodiment according to the present invention, the plurality of memory cells have a plurality of input/output ports so that it is possible to access the plurality of memory cells simultaneously.

In the synchronous random access memory as another preferred embodiment according to the present invention, the plurality of memory cells are divided into a plurality of banks and each of the plurality of banks is accessed independently.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the synchronous random access memory according to the present invention will now be described with reference to the drawings.

Embodiment

Figure 6A:
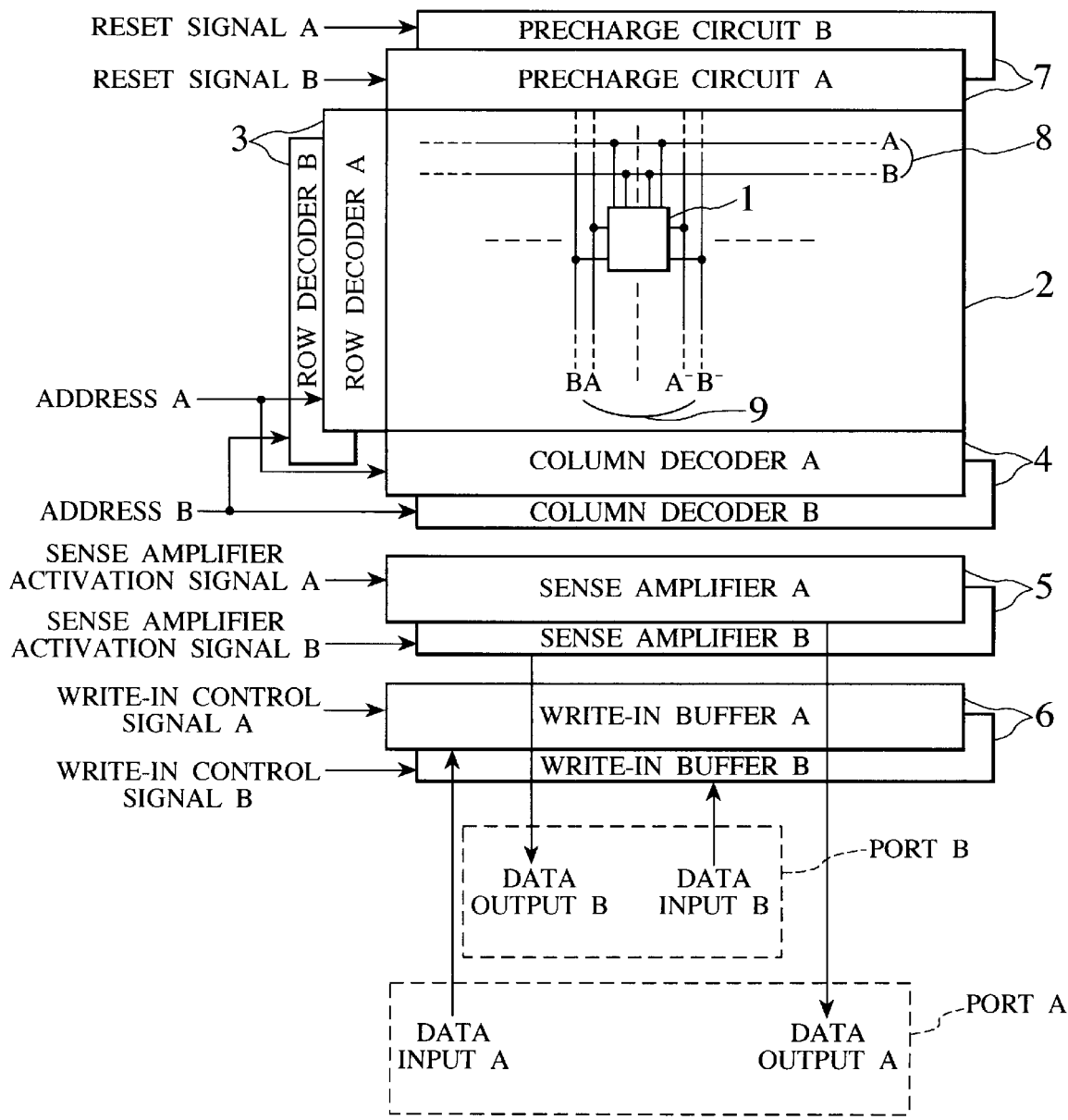
FIG. 6A is a diagrams showing the configuration of a synchronous random access memory according to a preferred embodiment of the present invention.
Figure 6B:
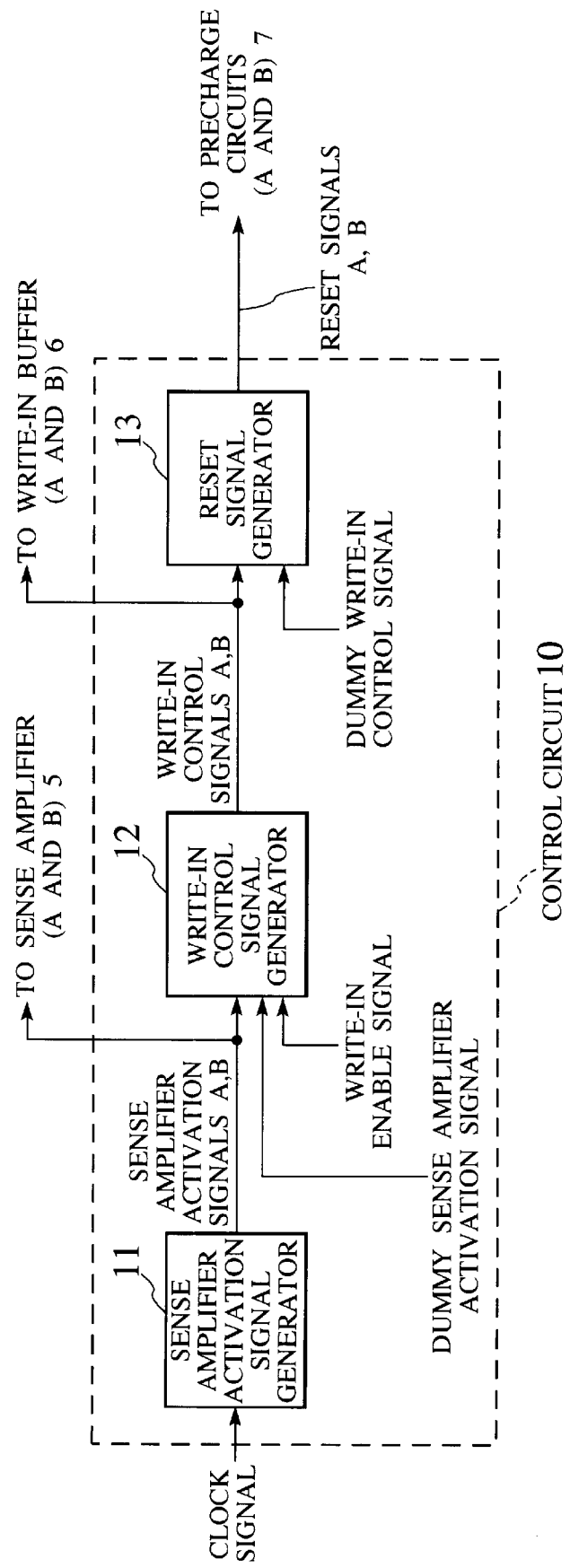
FIG. 6B is a block diagram showing the configuration of a control circuit incorporated in the synchronous random access memory of the preferred embodiment shown in FIG. 6A.
Figure 7:
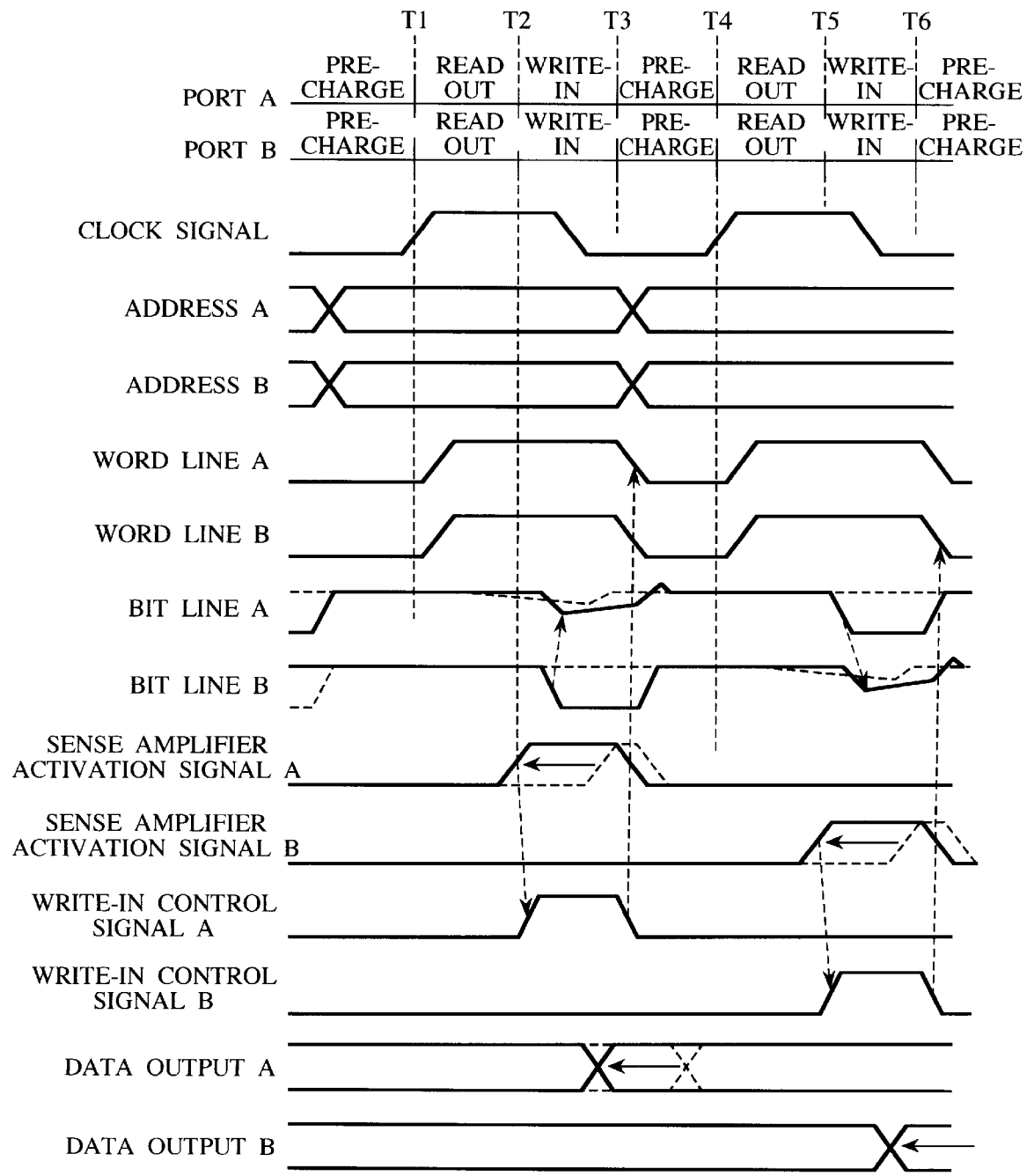
FIG. 7 is a timing chart showing the timing of the memory access operation of the synchronous random access memory of the preferred embodiment shown in FIGS. 6A and 6B.

FIG. 6A is a block diagram showing the configuration of the synchronous random access memory of a preferred embodiment according to the present invention, as shown in FIG. 6A. FIG. 6B is a block diagram showing the configuration of a control circuit incorporated in the synchronous random access memory of the preferred embodiment according to the present invention, as shown in FIG. 6A. FIG. 7 is a timing chart showing the timing of the memory access operation of the synchronous random access memory of the preferred embodiment shown in FIGS. 6A and 6B.

Figure 3:
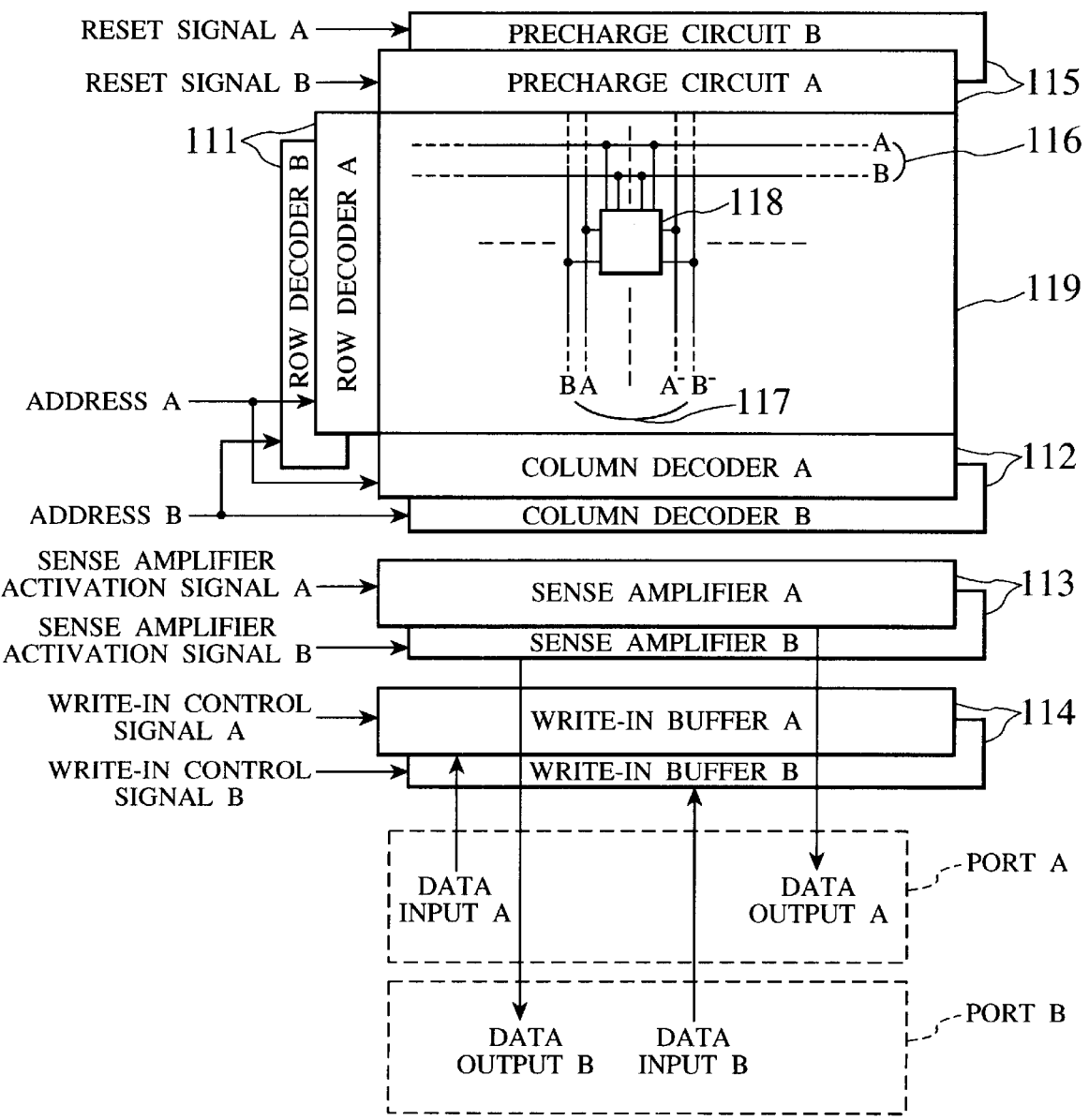
FIG. 3 is a diagram showing a configuration of another conventional synchronous random access memory having two ports.
Figure 4:
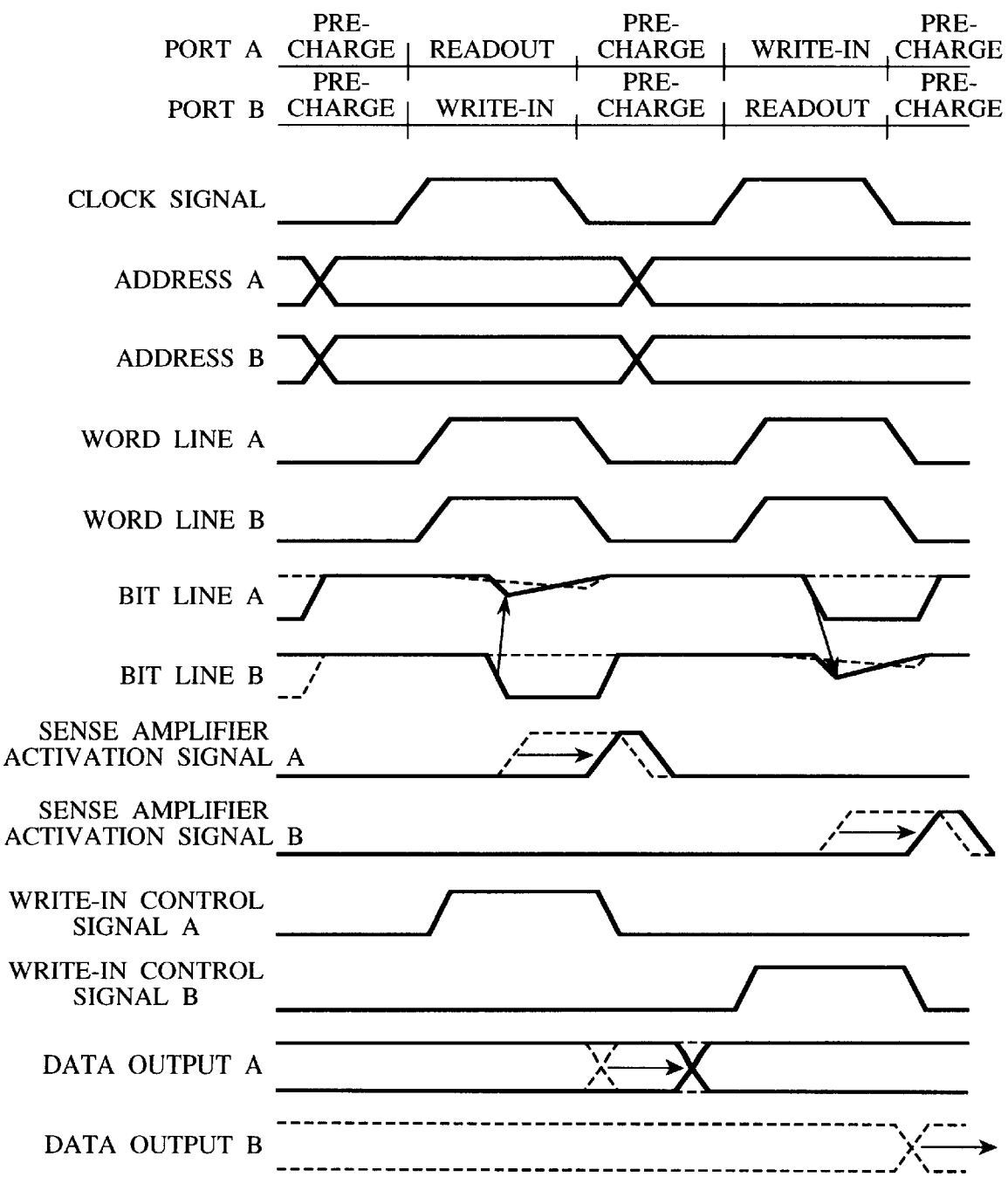
FIG. 4 is a timing chart of the operation of the conventional synchronous random access memory shown in FIG. 3.

The synchronous random access memory of the embodiment shown in FIG. 6A comprises a memory array 2 having a plurality of memory cells 1 and two ports (port A and Port B) for data input/output operations. Just as the conventional synchronous random access memory has the configuration shown in FIG. 3, the synchronous random access memory of this embodiment of the present invention shown in FIG. 6A comprises the memory array 2 having a plurality of memory cells 1 arranged in an array form, row decoders (A for the port A and B for the port B) 3 and column decoders (A for the port A and B for the port B) 4 as selection means for selecting one of the plurality of memory cells 1 based on a received input address, sense amplifiers (A for the port A and B for the port B) 5 of a latch type as readout means for amplifying the data items stored in the selected memory cell 1 through the bit liens and for providing the amplified data item, writein buffers (A for the port A and B for the port B) 6 as a writein means for writing a data item into the target memory cell selected by both the row decoders (A and B) 3 and the column decoders (A and B) 4, and precharge circuits (A for the port A and B for the port B) 7 as reset means for resetting the plurality of memory cells 1 and the bit lines into an enable state in which data writein operation and data readout operation may be performed.

Figure 5:
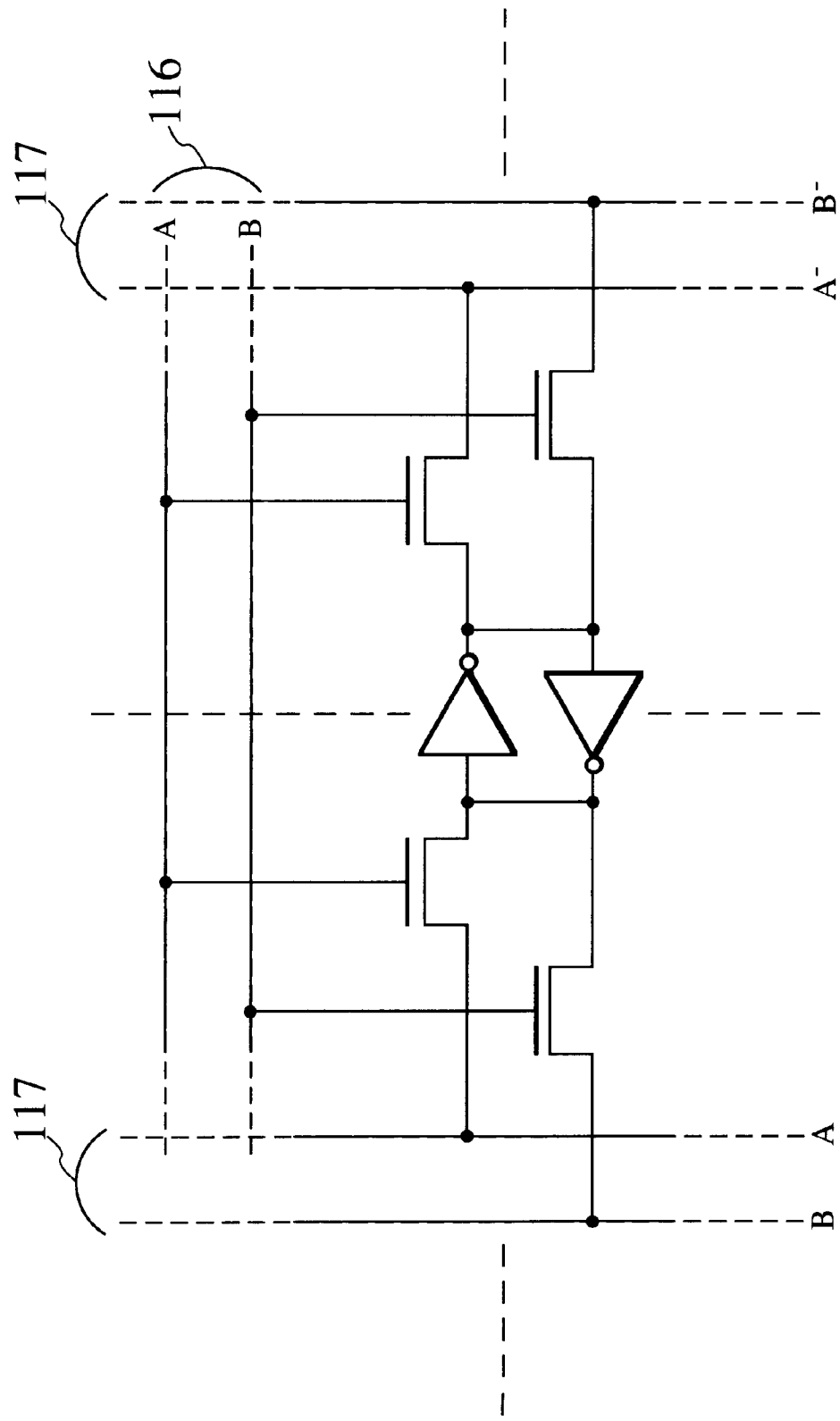
FIG. 5 is a diagram showing a configuration of a memory cell in the conventional synchronous random access memory of the two ports shown in FIG. 3.

As shown in FIG. 5, each of the plurality of memory cells in the synchronous random access memory of this embodiment has two pairs of word lines (A and B) 8 and two pairs of bit lines (A and /A, and B and /B) 9.

In addition, as shown in FIG. 6B, the synchronous random access memory of the embodiment shown in FIG. 6A has a control circuit 10 as a control means comprising a sense amplifier activation signal generation circuit 11 (or a sense amplifier activation signal generator), a write-in control signal generation circuit 12 (or a write-in control signal generator), and a reset signal generation circuit 13 (or a reset signal generator). The synchronous random access memory of this embodiment according to the present invention operates under the control of the control circuit 10 in which three operations, a data readout operation in a data readout period (for example, during the timings T1 to T2 and during the timings T4 to T5 shown in FIG. 7), a data write-in operation in a data writein period (for example, during the timings T2 to T3 and during the timings T5 to T6 shown in FIG. 7), and a reset operation or a precharge operation in a reset period (for example, during the timings T3 to T4) are performed continuously in order (hereinafter, it is also referred to as an operation cycle).

Next, a description will be given of the operation of the sense amplifier signal generation circuit 11, the writein control signal generation circuit 12, and the reset signal generation circuit 13 in the control circuit 10 shown in FIG. 6B.

The sense amplifier activation signal generation circuit 11 generates sense amplifier activation signals A and B to activate the sense amplifiers (A and B) 5 after the voltage levels of both the word lines (A and B) 8 rise by triggering a rising edge of the clock signal (for example, at the timings T1 or T4). The sense amplifier activation signals A and B are transferred to the sense amplifiers (A and B) 5 and also transferred to the writein control signal generation circuit 12.

The writein control signal generation circuit 12 receives a writein enable signal (WE) transferred from a CPU or an arithmetic unit (omitted from the drawings) and the sense amplifier activation control signals (A and B) from the sense amplifier activation signal generation circuit 11, and then generates writein control signals (A and B), having a desired pulse width for the data writein operation, by triggering the rising edges of the received sense amplifier activation control signals (A and B). The generated writein control signals (A and B) are provided to the writein buffers (A and B) 6 and also provided to the reset signal generation circuit 12.

When receiving the writein control signals (A and B) from the writein control signal generation circuit 12, the reset signal generation circuit 13 generates reset signals A and B by triggering a falling edge of the writein control signals. The reset signals A and B enter the precharge circuits (A and B) 7 into a reset state. The reset signal generation circuit 13 then provides the generated reset signals A and B to the precharge circuits (A and B) 7. In addition, the synchronous random access memory of this embodiment further comprises a dummy readout circuit (omitted from the drawings) and a dummy writein circuit (omitted from the drawings). The dummy readout circuit generates a dummy sense amplifier activation signal even if no data readout operation performs and the data writein operation performs. The generated dummy sense amplifier activation signal is provided to the writein control signal generation circuit 12, instead of the formal sense amplifier activation signals A, B, in order to generate the writein control signals A, B.

On the other hand, even if only the data readout operation performs and no data writein operation performs, the dummy writein circuit operates and generates a dummy writein control signal and then provides the generated dummy writein control signal to the reset signal generation circuit 13 instead of the formal writein control signals A and B.

In the synchronous dynamic random access memory having the configuration shown in FIGS. 6A and 6B, the data readout period in the operation cycle is set during the time period from the rising edge of the clock signal to the time at which the sense amplifier activation signal is generated (for example, during the timings T1 to T2). Further, the writein period in the operation cycle is set during the generation of the writein control signals A and B (for example, during the timings T2 to T3). The reset period in the operation cycle is set during the generation of the reset signals A and B from the reset signal generation circuit 13.

In the operation cycle including these three periods of the synchronous random access memory of the embodiment described above, when a target address indicating a target memory cell 1 in the memory cell array 2 is provided to the row address decoders (A and B) 3, as shown in FIG. 7, the word lines A and B corresponding to the addresses A and B rise by triggering the rising edge of the clock signal (the timing T1). Thereby, a small voltage potential of the data stored in the target memory cell 1 is output to the bit lines 9.

As described previously, the data readout operation must be executed before the execution of the data writein operation in the synchronous random access memory of the embodiment. For example, when the port A is used for the data readout operation and the port B is used for the data writein operation, only the sense amplifier activation signal only for the port A is generated. Thereby, the small voltage potential of the data on the bit line (A) 9 is amplified and transferred to external devices through the port A.

Latch type sense amplifiers are gradually using as the sense amplifiers (A and B) 5 in order to provide the high speed operation and to satisfy a low power consumption. In these latch type sense amplifiers, once the sense amplifier activation signal is activated, the voltage potential of the data on the bit line is amplified instantly. That is, when the sense amplifier activation signal is activated, the data on the bit line is established. In other words, after once the activation signal is activated, any noise on the bit line does not affect the voltage potential of the readout data item on the bit line even if the noise is added onto this bit line. Therefore the data readout period is completed when the sense amplifier activation signal is activated. After this, the data readout process is executed.

The writein control signal is triggered by the rising edge of the sense amplifier activation signal (for example, the timings T2 and T5), and then the writein control signal has a desired pulse width required to the data writein operation. In this case, only the writein control signal B for the port B is activated (the timing T2), the data item to be written into the target memory cell 1 is transferred onto the bit lines (B and /B) 9. At this time, although coupling noise is propagated from the bit lines (B and /B) 9 for the port B to the bit lines (A and /A) 9 for the port A, this coupling noise does not affect the readout data item because the amplification operation for the sense amplifiers (A and B) 5 has been completed.

The word lines (A and B) 8 enter the inactive state by triggering the falling edge of the writein control signals (For example, the timings T3 and T9). Thereby, the data writein period is completed, and following this, the reset period is then started. In this state, the reset signals are generated and transferred to the precharge circuits (A and B) 7. Thereby, All of the word lines and the bit lines enter the initial state in which the data writein operation and data readout operation may be performed.

On the other hand, when the data readout operation through both the ports A and B is performed, under the control by the control circuit 10, both the sense amplifier activation signals A and B are activated during the data readout period, and transferred to both the sense amplifiers (A and B) 5 and the target data items A and B are readout from the target memory cells through the ports A and B. After this, the reset operation is started by using the dummy writein control signals.

Furthermore, when the data writein operation through both the ports A and B is performed, under the control by the control circuit 10, after the data readout operation is performed by using the dummy sense amplifier control signals, both the writein control signals A and B are activated during the data writein period, and transferred to both the writein buffers (A and B) 6 and the target data items A and B are written into the target memory cells through the ports A and B.

As described above, because the data writein operation and the data readout operation are distinguished from each other in operation time under the control by the control circuit 10 in the synchronous random access memory, even if the data readout operation and the data writein operation are performed on adjacent bit lines, both the data writein operation and the data writein operation performed on the adjacent bit lines are not overlapped in time. In addition to this, the coupling noise of the bit lines 9 does not affect the readout operation that is performing on the adjacent bit lines.

Figure 1:
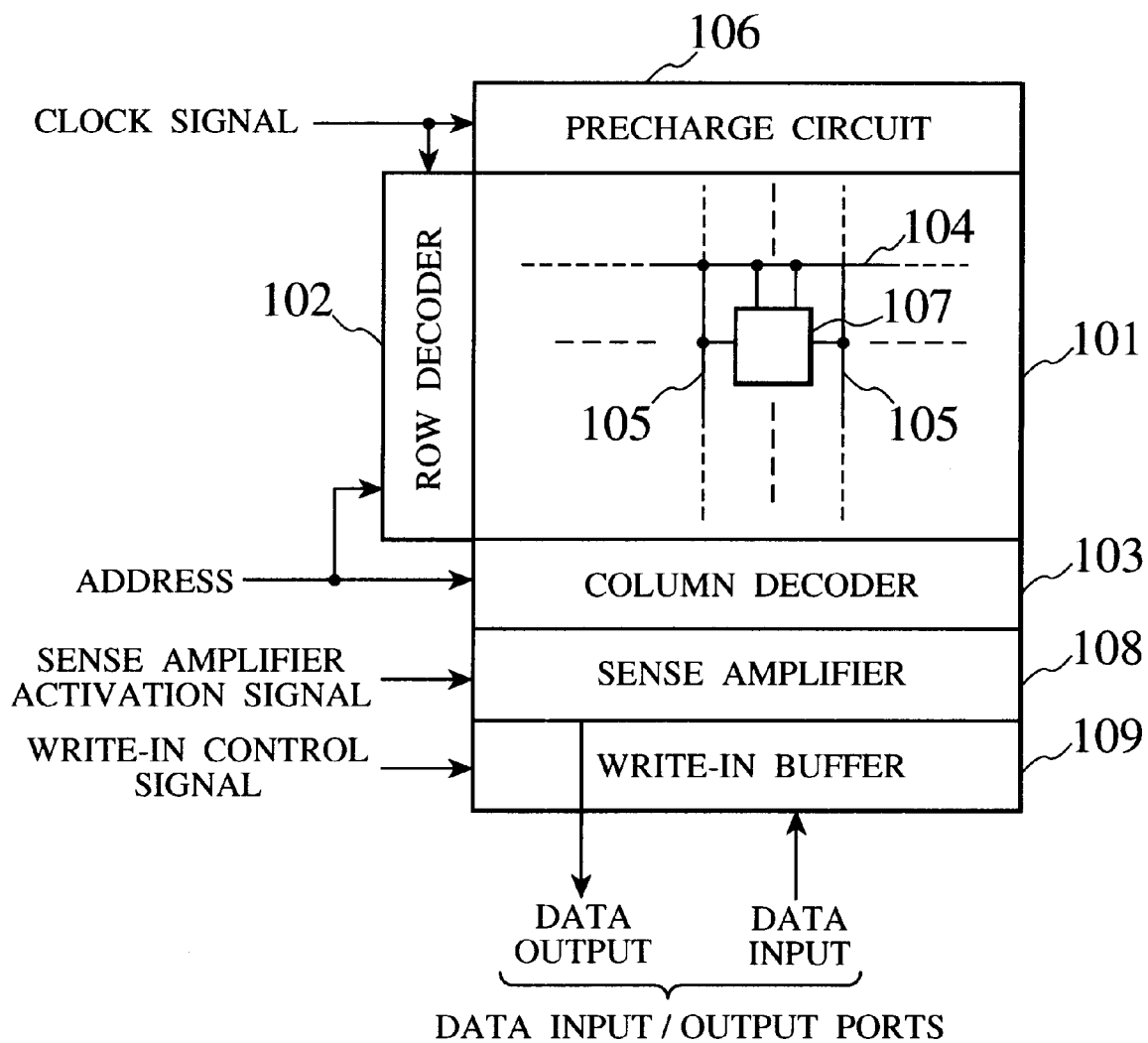
FIG. 1 is a diagram showing a configuration of a conventional synchronous random access memory described above.
Figure 2:
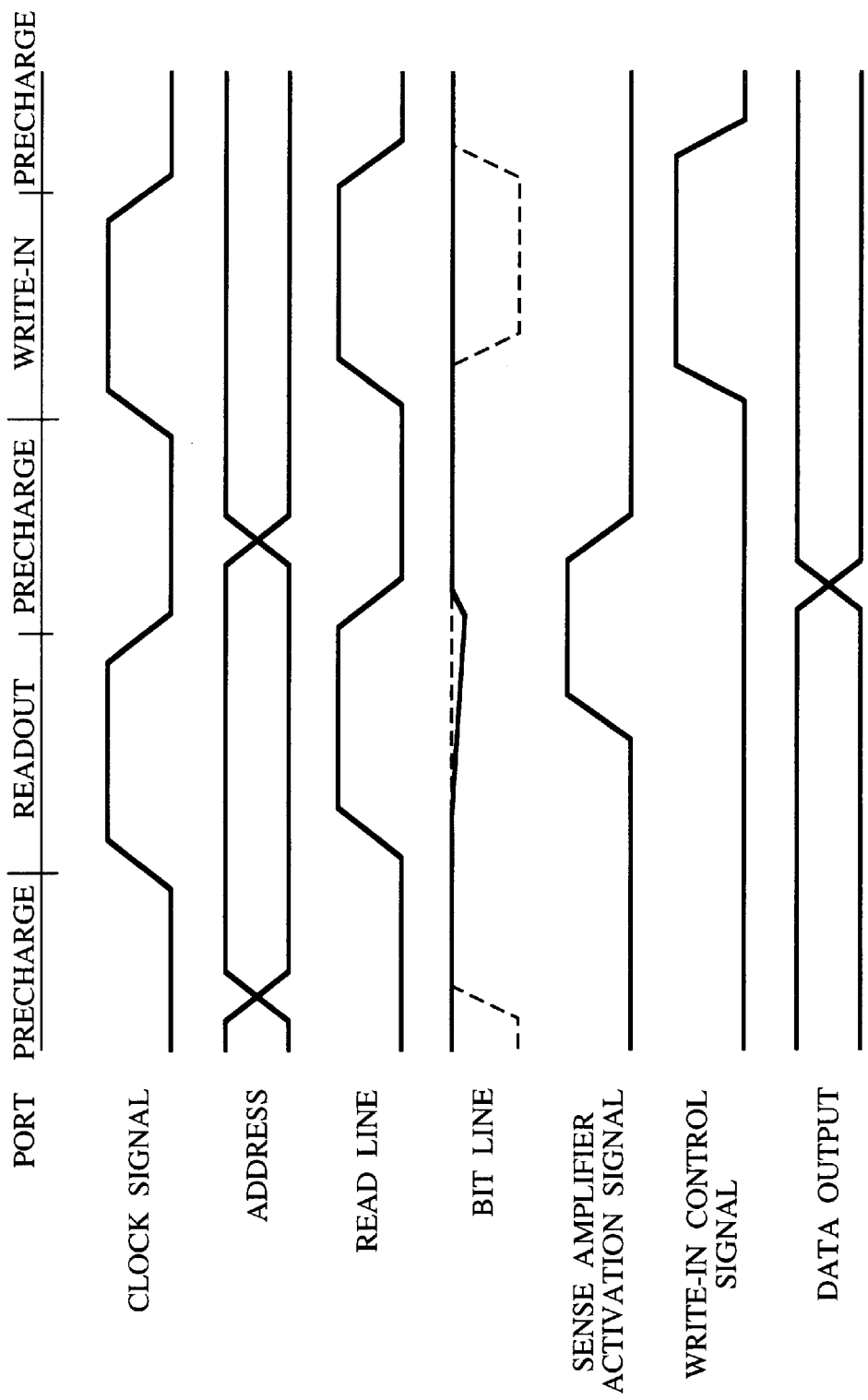
FIG. 2 is a timing chart showing the timing of the memory access operation of the conventional synchronous random access memory shown in FIG. 1.

Furthermore, because the control circuit 10 performs the precharge period after the data writein period, it is possible to avoid the influence of the coupling noise of the bit lines generated at the time of the completion of the data writein operation to the data readout operation. Accordingly, according to the synchronous random access memory of the embodiment, because the sense amplifier activation signals may be activated earlier in time than the conventional case designated by using dotted lines in FIG. 2, the operation of the data output may be also performed earlier in time than the conventional case designated by using dotted lines in FIG. 2. This causes to suppress the delay of the data readout operation.

Furthermore, it is acceptable to determine the data readout operation, the data writein operation, and the reset operation forming the operation cycle of the synchronous random access memory based on the clock signal generated by the clock signal generation circuit 10. In this case, for example, it is possible to set the data readout period, the data writein period and the reset period as follows:

The data readout period is a time period from the rising edge of the clock signal to the time that the data item on the bit lines is latched by the sense amplifiers 5 to the data readout period;

The data writein period is a time period from the completion of the data readout period to the falling edge of the clock signal, or a time period from the falling edge of the clock signal to a predetermined time elapsed; and The reset period is a time period from the completion of the data writein period to the falling edge of the clock signal.

Thus, those time periods of the data readout period, the data writein period and the reset period may be set according to the specification of a memory to be used and applications.

In addition, although the synchronous random access memory having the two ports as the preferred embodiment is shown in the above explanation, the present in not limited by this case, for example, it is acceptable to have one port, three ports, four ports, or many ports more than four in the synchronous random access memory and to have the same effect of the embodiment described above.

Furthermore, the present invention may be applied to a memory and it is possible to obtain the same effect because the coupling noise is generated at a boundary region of adjacent banks in this memory having one port or two ports and a memory cell array that is divided into a plurality of banks and each bank is accessed independently. That is, the concept of the present invention may be applied to synchronous memories that are capable of performing the data readout operation and the data writein operation at adjacent bit lines.

As described above in detail, according to the synchronous random access memory of the present invention, under the control by the control circuit 10, the reset period, the data readout period, and the data writein period are performed in order and formed to the memory cycle. In addition to this, because it is so designed that the data readout period and the data writein period are not overlapped in time, even if the data readout process and the data writein process are performed on adjacent bit lines, it is possible to avoid the occurrence of the coupling noise between the adjacent bit lines. This causes to eliminate the occurrence of any error operation caused by the coupling noise between the adjacent bit lines without decreasing of the speed of the data readout operation. In addition to this, it is possible to avoid the overhead caused by the area and the power consumption based on the coupling noise between the adjacent bit lines.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A synchronous random access memory comprising:

a plurality of memory cells for storing data items;

selection means for selecting one of the plurality of memory cells according to an input address;

readout means for reading a data item stored in one of the plurality of memory cells based on the input address selected by the selection means;

writein means for writing a data item into one of the plurality of memory cells based on the input address selected by the selection means;

reset means for resetting the synchronous random access memory into a reset state in which a data readout operation from and a data writein operation to the plurality of memory cells may be performed; and control means for controlling operation of the plurality of memory cells during a reset period, a data writein period, and a data readout period for the plurality of memory cells, wherein the control means controls that in the reset period the plurality of memory cells are into the reset state in which the data readout operation from and the data writein operation to the plurality of memory cells may be performed, in the data readout period a data item stored in one of the plurality of memory cells, that is selected by the selection means after a completion of the reset period, is read by the readout means, and in the data writein period a data item is written into one of the plurality of memory cells, that is selected by the selection means after a completion of the data readout period, and wherein the control means controls that the reset period, the data readout period, and the data writein period forming a memory cycle are performed in order, and the control means controls that all of memory access operations to the plurality of memory cells are performed within the data readout period and the data writein period in synchronism with a clock signal.

2. A synchronous random access memory as claimed in claim 1, wherein the control means controls the memory access operation to the plurality of memory cells so that the reset period is shifted to the data readout period when a first voltage level of the clock signal is switched to a second voltage level of the clock signal, and the data readout period is shifted to the data writein period after a predetermined time is elapsed after the first voltage level of the clock signal is switched to the second voltage level, and the data writein period is shifted to the reset period after the second voltage level of the clock signal is switched to the first voltage level, or after a predetermined time is elapsed after the second voltage level of the clock signal is switched to the first voltage level.

3. A synchronous random access memory as claimed in claim 1, wherein the control means controls the memory access operation to the plurality of memory cells so that the reset period is shifted to the data readout period when a first voltage level of the clock signal is switched to a second voltage level of the clock signal, and the data readout period is shifted to the data writein period in synchronism with a sense amplifier activation control signal indicating to start an operation to latch and then amplify a data item stored in one of the plurality of memory cells read on bit lines, and the data writein period is shifted to the reset period in synchronism with a writein control signal indicating to start the data writein operation and indicating a time length of the data writein operation.

4. A synchronous random access memory as claimed in claim 1, wherein the plurality of memory cells have a plurality of input/output ports so that it is possible to access the plurality of memory cells simultaneously.

5. A synchronous random access memory as claimed in claim 2, wherein the plurality of memory cells have a plurality of input/output ports so that it is possible to access the plurality of memory cells simultaneously.

6. A synchronous random access memory as claimed in claim 3, wherein the plurality of memory cells have a plurality of input/output ports so that it is possible to access the plurality of memory cells simultaneously.

7. A synchronous random access memory as claimed in claim 1, wherein the plurality of memory cells are divided into a plurality of banks and each of the plurality of banks is accessed independently.

8. A synchronous random access memory as claimed in claim 2, wherein the plurality of memory cells are divided into a plurality of banks and each of the plurality of banks is accessed independently.

9. A synchronous random access memory as claimed in claim 3, wherein the plurality of memory cells are divided into a plurality of banks and each of the plurality of banks is accessed independently.

10. A synchronous random access memory as claimed in claim 4, wherein the plurality of memory cells are divided into a plurality of banks and each of the plurality of banks is accessed independently.

11. A synchronous random access memory as claimed in claim 5, wherein the plurality of memory cells are divided into a plurality of banks and each of the plurality of banks is accessed independently.

12. A synchronous random access memory as claimed in claim 6, wherein the plurality of memory cells are divided into a plurality of banks and each of the plurality of banks is accessed independently.

* * * * *